(12) United States Patent
Melman

(10) Patent No.: US 8,227,276 B2
(45) Date of Patent: Jul. 24, 2012

(54) MANUFACTURE OF LIGHT EMITTING DEVICES WITH PHOSPHOR WAVELENGTH CONVERSION

(75) Inventor: Jonathan Melman, San Ramon, CA (US)

(73) Assignee: Intematix Corporation, Fremont, CA (US)

( * ) Notice: Subject to any disclaimer, the term of this patent is extended or adjusted under 35 U.S.C. 154(b) by 246 days.

(21) Appl. No.: 12/782,857

(22) Filed: May 19, 2010

(65) Prior Publication Data

US 2010/0295079 A1 Nov. 25, 2010

Related U.S. Application Data

(60) Provisional application No. 61/179,671, filed on May 19, 2009.

(51) Int. Cl.
  *H01L 33/00* (2010.01)
  *H01L 21/00* (2006.01)
(52) U.S. Cl. ............ 438/33; 438/26; 438/460; 438/463; 257/99; 257/100; 257/E33.056; 257/E33.059; 257/E21.599
(58) Field of Classification Search .................... 438/26, 438/33, 460, 463; 257/99, 100, E33.056, 257/E33.059
See application file for complete search history.

(56) References Cited

U.S. PATENT DOCUMENTS

| | | | |
|---|---|---|---|
| 5,998,925 A | 12/1999 | Shimizu | |
| 6,838,299 B2 * | 1/2005 | Mulligan et al. | 438/33 |
| 7,049,159 B2 | 5/2006 | Lowery | |
| 7,311,858 B2 | 12/2007 | Wang | |
| 7,344,952 B2 | 3/2008 | Chandra | |
| 7,390,437 B2 | 6/2008 | Dong | |
| 7,575,697 B2 | 8/2009 | Li | |
| 7,585,751 B2 * | 9/2009 | Kirihara et al. | 438/462 |
| 7,601,276 B2 | 10/2009 | Li | |
| 7,863,160 B2 * | 1/2011 | Iizuka | 438/463 |
| 7,897,488 B2 * | 3/2011 | Watanabe et al. | 438/463 |
| 2005/0274967 A1 | 12/2005 | Martin et al. | |
| 2006/0009008 A1 * | 1/2006 | Kaneuchi et al. | 438/463 |
| 2006/0097621 A1 | 5/2006 | Park et al. | |
| 2006/0158090 A1 | 7/2006 | Wang et al. | |
| 2006/0284207 A1 | 12/2006 | Park et al. | |
| 2007/0029526 A1 | 2/2007 | Cheng et al. | |
| 2008/0020548 A1 * | 1/2008 | Morikazu et al. | 438/463 |
| 2008/0076198 A1 | 3/2008 | Park et al. | |
| 2008/0111472 A1 | 5/2008 | Liu et al. | |
| 2008/0132035 A1 * | 6/2008 | Kondo | 438/463 |
| 2008/0268619 A1 * | 10/2008 | Nakamura | 438/463 |
| 2009/0117672 A1 | 5/2009 | Caruso et al. | |
| 2009/0134414 A1 | 5/2009 | Li et al. | |
| 2009/0283721 A1 | 11/2009 | Liu et al. | |
| 2010/0304551 A1 * | 12/2010 | Takanashi et al. | 438/463 |

* cited by examiner

*Primary Examiner* — David Zarneke
(74) *Attorney, Agent, or Firm* — Fliesler Meyer LLP

(57) ABSTRACT

A method of manufacturing a light emitting device comprises: depositing over substantially the entire surface of a LED wafer having a array of LEDs formed on a surface thereof a mixture of at least one phosphor and a polymer material, wherein the polymer material is transmissive to light generated by the LEDs and to light generated by the at least one phosphor material; using laser ablation to selectively make apertures in the phosphor/polymer material corresponding to electrode contact pads of each LED thereby enabling access to each electrode contact pad; and dividing the wafer into individual light emitting devices. The method can further comprise, prior to dividing the wafer, cutting slots in the phosphor/polymer material which are configured to pass between individual LEDs. The slots are configured such that a layer of phosphor/polymer material remains on the edges of each LED after division of the wafer into individual light emitting devices.

20 Claims, 10 Drawing Sheets

MANUFACTURE OF LIGHT EMITTING DEVICES WITH PHOSPHOR WAVELENGTH CONVERSION

CROSS-REFERENCE TO RELATED APPLICATIONS

This application claims the benefit of priority of U.S. Provisional Application No. 61/179,671, filed May 19, 2009, the contents of which are incorporated herein by reference.

BACKGROUND OF THE INVENTION

1. Field of the Invention

The invention relates to methods of manufacture of light emitting devices with phosphor wavelength conversion. More particularly the invention concerns a method of applying a phosphor material to a light emitting diode (LED).

2. Description of the Related Art

White light emitting LEDs ("white LEDs") are known in the art and are a relatively recent innovation. It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more phosphor materials, that is photo-luminescent materials, which absorb a portion of the radiation emitted by the LED and re-emit radiation of a different color (wavelength). Typically, the LED chip or die generates blue light and the phosphor(s) absorbs a percentage of the blue light and re-emits yellow light or a combination of green and red light, green and yellow light, green and orange or yellow and red light. The portion of the blue light generated by the LED that is not absorbed by the phosphor combined with the light emitted by the phosphor provides light which appears to the human eye as being nearly white in color.

An example of the manufacture of a gallium nitride (GaN) based white LED is shown schematically in FIGS. 1a to 1d. As shown in FIG. 1a an LED wafer 10 comprises a wafer (substrate) 12, typically sapphire, that has one or more layers of n-type gallium nitride 14 and p-type gallium nitride 16 materials epitaxially grown on its surface and configured to define a plurality of LED chips 18. Each LED chip 18 has respective n-type and p-type electrode pads 20, 22 on its upper surface for providing electrical connection to the chip. As is known in other device structures one or both electrode pads 20, 22 can be provided on the substrate side of the LED. To fabricate a white LED the LED wafer is 10 is divided (diced) into individual LED chips 18 by for example laser scribing and breaking or by mechanical sawing using a diamond saw (FIG. 1b). Each LED chip 18 is then individually mounted in a package (housing) 24 or mounted to a lead frame (FIG. 1c).

The package 24, which can for example comprise a low temperature co-fired ceramic (LTCC) or high temperature polymer, comprises upper and lower body parts 26, 28. The upper body part 26 defines a recess 30, often circular in shape, which is configured to receive one or more LED chips 18. The package 24 further comprises electrical connectors 32, 34 that also define corresponding electrode contact pads 36, 38 on the floor of the recess 30. Using adhesive or soldering the LED chip 18 is mounted to the floor of the recess 30. The LED chip's electrode pads 20, 22 are electrically connected to corresponding electrode contact pads 36, 38 on the floor of the package using bond wires 40, 42. The recess 30 is then completely filled with a transparent polymer material 44, typically a silicone, which is loaded with the powdered phosphor material(s) such that the entire surface of the LED chip is covered by the phosphor/polymer mixture. To enhance the emission brightness of the device the inner walls of the recess 30 are often inclined and light reflective. Optionally, a lens (not shown), whose dimensions correspond to the dimensions of the recess, is mounted on the package to focus or otherwise direct the light emission of the device.

A drawback with such a method of manufacture is cost, since phosphor has to be applied to the LED chip on an individual basis. In addition the color hue of light generated by the device, or in the case of a white light emitting device the correlated color temperature (CCT), can vary significantly between devices that are supposed to be nominally the same. The problem of color/CCT variation is compounded by the fact that the human eye is extremely sensitive to subtle changes in color hue especially in the white color range. As is known, the correlated color temperature (CCT) of a white light source is determined by comparing its hue with a theoretical, heated black-body radiator. CCT is specified in Kelvin (K) and corresponds to the temperature of the black-body radiator which radiates the same hue of white light as the light source. The CCT of a white LED is generally determined by the phosphor composition, the quantity of phosphor incorporated in the device and its actual location/distribution.

As well as the variation between devices in the color/correlated color temperature (CCT) of emitted light, it is found that the color/CCT can vary across the light emitting surface of the device. The color/CCT depends on the thickness of phosphor/polymer and the distance (i.e. path length) that light travels from the LED chip through the phosphor/polymer encapsulation before being emitted from the device. As shown in FIG. 2, light 46 which is emitted substantially on axis will have traveled a shorter path length 48 within the phosphor/polymer encapsulation than light 50 emitted off axis towards the periphery of the device in which the path length 52 is correspondingly longer. As a result the light 46 emitted substantially on axis will have a higher proportion of blue light compared to yellow (phosphor generated light) and will appear to be blue-white in color. Conversely light 50 emitted off axis towards the periphery of the recess will have a correspondingly higher proportion of yellow light emitted by the phosphor and will appear yellow-white in color. For general lighting applications, where for example a diffuser is used, this variation in color is not a problem as the lit object itself will also increase illumination color uniformity.

Furthermore, in applications in which the device includes further optical components, in particular a lens, to focus the output light, such color/CCT variation can become a significant problem. For example for a white LED which includes a lens, the focused light spot will have a blue-white core with a pronounced yellow-white periphery.

In addition to the problem of non-uniformity in emitted color/CCT due to the variation in path length through the phosphor/polymer encapsulation, it is found that the phosphor material(s) can accumulate unevenly during curing of the liquid polymer resulting in a non-uniform distribution of the phosphor material(s) over the LED chip and in particular on the edges of the LED chip, which will also emit light, where there may be little or no phosphor material(s). As illustrated in FIG. 2 the phosphor material can accumulate on the bond wires 54, on the upper surface 56 of the LED chip, on the floor 58 of the recess and on the inclined light reflective walls 60 of the package. To overcome this problem a greater quantity of phosphor material is often used though this will result in a corresponding decrease in emitted light intensity.

The inventor has appreciated that the variation in color hue can additionally depend on factors including:
- variations in bonding wire shape and location which can affect the wetting of the phosphor
- adhesive bleed out which can affect the wetting of the phosphor
- variations in emission direction of the LED chip
- variations in the reflector characteristic
- variations or aging in the phosphor/silicone blend
- wavelength emission distribution of LED chips.

It is believed that all of these factors can affect the color hue/CCT of light generated by a light emitting device with phosphor wavelength conversion.

US 2006/0097621 teach a method of manufacturing a white LED comprising dispensing droplets of a high viscosity liquid phosphor paste on an upper surface of the LED such that the phosphor paste is applied onto the upper surface and side surfaces of the LED and then curing the phosphor paste. The phosphor paste comprises a phosphor powder mixed with a transparent polymer resin and has a viscosity of 500~10,000 cps. The volume of the phosphor paste droplet and viscosity of the phosphor paste are selected such that the phosphor paste covers the upper surface and side surfaces of the LED and allows the phosphor paste to be uniformly applied to the side surfaces as well as the upper surface. After application of the phosphor paste the polymer resin is cured and the LED chip is connected to the package using bond wires. Finally the package is filled with a transparent polymer material to protect the bond wires.

As taught in our co-pending United States patent application publication No. US 2009/0134414, published Oct. 22, 2009, a method of fabricating a light emitting device comprises: heating a light emitting diode chip package assembly to a pre-selected temperature and dispensing a pre-selected volume of a mixture of at least one phosphor and a light transmissive thermosetting material (silicone, epoxy) on a surface of the LED chip. The pre-selected volume and temperature are selected such that the phosphor/material mixture flows over the entire light emitting surface of the LED chip before curing. In an alternative method, using a light transmissive UV curable material such as an epoxy, the phosphor/material mixture is irradiated with UV radiation after a pre-selected time to cure the material. The pre-selected volume and pre-selected time are selected such that the phosphor/material mixture flows over at least the light emitting surface of the LED chip before curing.

To alleviate the problem of color variation in light emitting devices with phosphor wavelength conversion, in particular white LEDs, are categorized post-production using a system of "bin out" or "binning." In binning, each LED is operated and the actual color of its emitted light measured. The LED is then categorized or binned according to the actual color of light the device generates rather than according to the target CCT with which it was produced. A disadvantage of binning is increased production costs and a low yield rate as often only two out of the nine bins are acceptable for an intended application resulting in supply chain challenges for white LED suppliers and customers.

Various methods of applying the phosphor to the LED chip have been proposed in an effort to improve coating uniformity and color hue and CCT consistency. For example, US 2008/0076198 describe a method of manufacturing an LED package comprising: forming a resin mold encapsulating an LED chip and then forming a phosphor thin film on a surface of the resin mold by spray coating a phosphor-containing material on the surface of the resin mold.

U.S. Pat. No. 7,344,952 describe a process for manufacturing LEDs that utilize phosphor wavelength conversion. LED dies (chips) are tested for CCT and binned according to their color emission. The LEDs in a single bin are mounted on a single submount (substrate) to form an array of LEDs. Various thin sheets of a flexible encapsulant (e.g. silicone) containing one or more phosphors are preformed, where each sheet has different color conversion properties. An appropriate sheet is place over an array of LEDs on a submount, and the LEDs are energized. The CCT of the emitted light is measured. If the CCT is acceptable, the phosphor sheet is permanently laminated onto the LEDs and submount. The LEDs in the array are separated into individual devices. By selecting a different phosphor sheet for each bin of LEDs, the resulting CCT is more consistent across the bins. Although such a process can produce LEDs with a more consistent CCT both the LED dies and phosphor sheet need to be binned and this can make the process expensive.

US 2005/0274967 teaches producing a sheet of wavelength converting (phosphor containing) material and then dividing the sheet into individual caps or elements. The light conversion characteristic of each cap is then measured and the caps binned according to their characteristic. The light emission characteristic of each packaged LED is measured and an appropriate cap bonded to the LED to produce a desired CCT of emitted light. Although this process can produce LEDs with a desired CCT, binning of LEDs and phosphor caps is required and this can make the process time consuming and expensive.

U.S. Pat. No. 7,049,159 describe forming a luminescent layer on light emitting devices that are mounted on a substrate. The method comprises positioning a stencil on a substrate such that the light emitting devices are located within a respective opening of the stencil, depositing a composition including the luminescent material in the opening, removing the stencil and curing the composition to a solid state.

US 2006/0284207 teach applying the phosphor material during formation of the LED package. LED chips are electrically connected to pattern electrodes on a substrate such as a PCB or ceramic substrate. Next an encapsulant, epoxy molding compound (EMC), containing the phosphor material is formed on each LED chip by transfer (injection) molding. After curing the encapsulant is cut around the periphery of the chip and a layer of a highly reflective metal formed on the periphery of the encapsulant by electrolysis, electro-plating or sputtering. The reflective layer defines the side wall of the packaged LED. Finally, the substrate is cut horizontally and vertically into individual LED packages.

In our co-pending United States patent application publication No. US 2009/0117672 A1, published May 7, 2009, a method of fabricating a light emitting device having a specific target color of emitted light is described. The method comprises: depositing a pre-selected quantity of the at least one phosphor material on a light emitting surface of the light emitting diode; operating the light emitting diode; measuring the color of light emitted by the device; comparing the measured color with the specific target color; and depositing and/or removing phosphor material to attain the desired target color.

A need exists still for a method of manufacturing light emitting devices with phosphor wavelength conversion that can produce devices with a more consistent color/CCT less expensively than the prior art solutions.

SUMMARY OF THE INVENTION

The present invention arose in an endeavor to address, at least in part, the problem of color hue and/or CCT variation of light emitting devices that include phosphor wavelength conversion and to reduce or even eliminate the need for binning packaged devices.

Embodiments of the invention are directed to processing and patterning the phosphor material for an entire LED wafer containing the light emitting devices prior to dividing and packaging individual LED chips. Unless otherwise indicated the term LED wafer refers to a wafer on which the LED chips are fabricated by depositing layers of n-type and p-type semiconductor materials. This is to be contrasted with a wafer or substrate onto which individual LED chips are mounted during packaging. By way of analogy with the chip manufacturing industry the method of the invention concerns providing the phosphor at the wafer level and can be considered as being at a level termed large scale integration (LSI).

According to the invention there is provided a method of manufacturing a light emitting device comprising a) depositing over substantially the entire surface of an LED wafer having an array of LEDs formed on a surface thereof a mixture of at least one phosphor and a light transmissive polymer material, wherein the polymer material is transmissive to light generated by the LEDs and to light generated by the at least one phosphor material; b) using laser ablation, selectively making apertures in the phosphor/polymer material corresponding to electrode contact pads of each LED thereby enabling access to each electrode contact pad; and c) dividing the LED wafer into individual light emitting devices.

Since there can, for a given LED wafer, be a significant variation in both intensity and wavelength of light emitted from individual LEDs that are nominally the same, the LED wafer is preferably first mapped and the intensity and wavelength of light from each LED measured. The required thickness and weight loading of phosphor to light transmissive polymer of the phosphor/polymer material layer to achieve a selected CCT of light emitted from the device can be calculated from the LED wafer mapping. Every LED on the wafer can be mapped or a representative sample, such as ≈50%, mapped. The phosphor loading and/or thickness of the phosphor/polymer material layer can be selected to correspond to LEDs requiring the least amount of phosphor. Those devices out of specification can be brought within specification by the subsequent addition of additional phosphor for example when the device is packaged. Alternatively the loading and/or of the phosphor/polymer material layer can be selected to maximize for a given LED wafer the number of devices having a selected CCT of emission product. Advantageously in accordance with the invention the method further comprises selecting a thickness of the phosphor/polymer material and weight loading of the at least one phosphor material to polymer material of the phosphor/polymer material on a basis of LEDs on the wafer having substantially the same emission characteristics. In one method the selection is made on a basis of LEDs that emit light of substantially the same intensity and/or emission wavelength. Additionally the selection can be made on a basis of the LEDs requiring a least amount of phosphor material and additional phosphor provided to devices to ensure they emit light of a selected color. Alternatively, and to maximize the yield of devices from the LED wafer, the selection can be made on the basis of the greatest number of LEDs on the LED wafer having substantially the same emission characteristics.

To avoid thermal degradation of the phosphor during laser ablation and/or to avoid separation of the phosphor/polymer from the LED wafer each aperture is preferably formed using a series (train) of laser pulses.

Prior to dividing the LED wafer in c) the LED wafer is preferably processed, using for example plasma ashing, to remove any remaining phosphor/polymer mixture or other debris on the base of each aperture. Such material/debris can prevent electrical contact being made to the LED's electrode pads.

Moreover, prior to dividing the LED wafer in c) the method further comprises cutting slots through the phosphor/polymer material that are configured to pass between individual LEDs. Preferably each slot further extends into the wafer to thereby aid in subsequent division of the wafer. The slots can be cut using laser ablation or by mechanical sawing using for example a diamond saw. In a preferred implementation the slots are configured such that a layer of phosphor/polymer material remains on the edges of each LED after division of the LED wafer into individual light emitting devices.

Prior to making the apertures in b) a sacrificial layer can be deposited over the phosphor/polymer layer for collecting debris generated during making of the apertures. The sacrificial layer and debris are removed after making the apertures. In one arrangement the sacrificial layer comprises a removable polymer film such as Mylar® film or Nitto® tape (manufactured by Nitto Denko Corporation) and is physically removed from the wafer after making of the apertures. Alternatively, the sacrificial layer can comprise a soluble material such as a polyvinyl alcohol (PVA) and is removed by dissolving the sacrificial layer in a solvent such as water.

The LED wafer can be divided into individual devices by scribing and breaking, laser ablation or mechanical sawing.

According to a further aspect of the invention there is provided a light emitting device manufactured according to the method of the invention.

BRIEF DESCRIPTION OF THE DRAWINGS

In order that the present invention is better understood embodiments of the invention will now be described, by way of example only, with reference to the accompanying drawings in which.

DETAILED DESCRIPTION OF THE INVENTION

Embodiments of the invention concern methods of manufacturing a light emitting device with phosphor wavelength conversion and in particular methods of applying/processing the phosphor material on an LED wafer prior to division of the wafer into individual LED chips. More particularly the method concerns patterning of the phosphor material to enable electrical connections to be made to the LED chip's electrode contacts once the wafer is subsequently divided into individual LED chips. The term "LED wafer" refers to a wafer (substrate) on which the LED chips are fabricated by depositing layers of n-type and p-type semiconductor materials. This is to be contrasted with a wafer (substrate) onto which individual LED chips are mounted post fabrication.

Figures 1A, 1B, 1C, 1D:
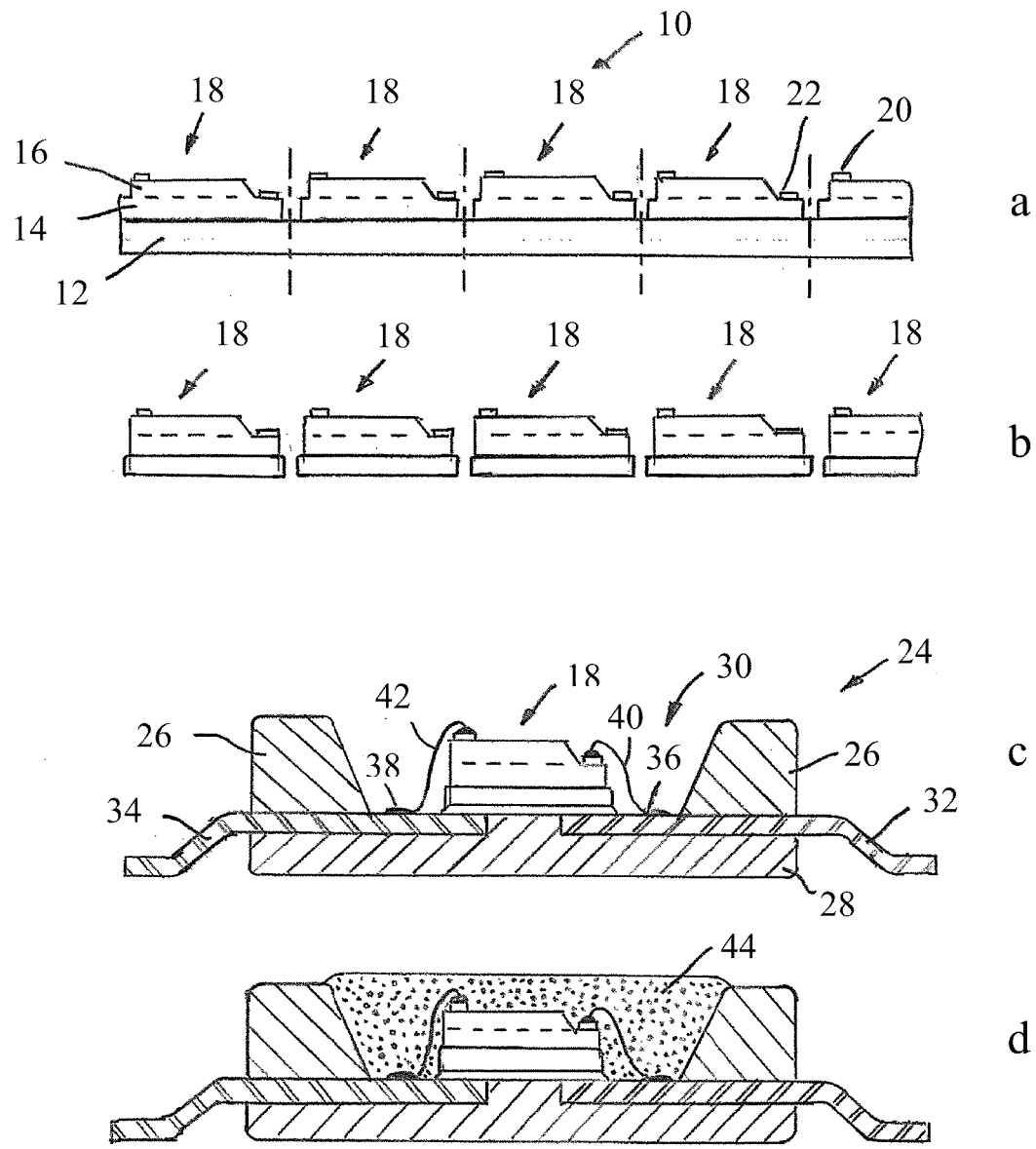
FIGS. 1a to 1d are schematic representations of a known method of manufacture of a light emitting device with phosphor wavelength conversion as previously described.
Figure 2:
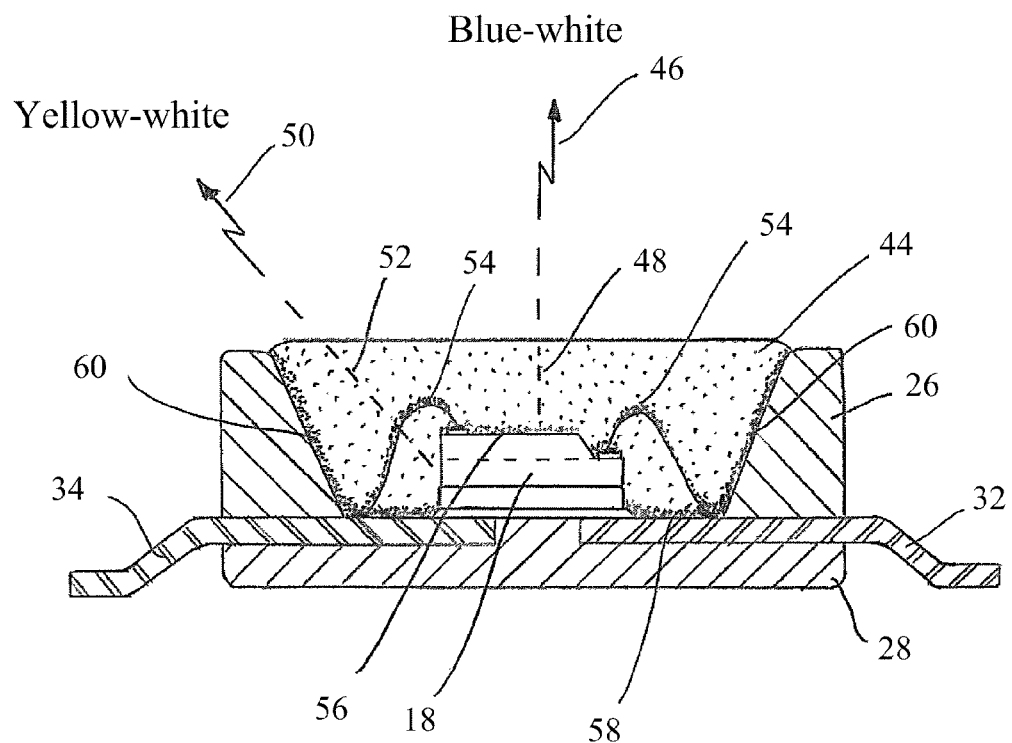
FIG. 2 is a schematic sectional representation of a known light emitting device with phosphor wavelength conversion as previously described.
Figure 3:
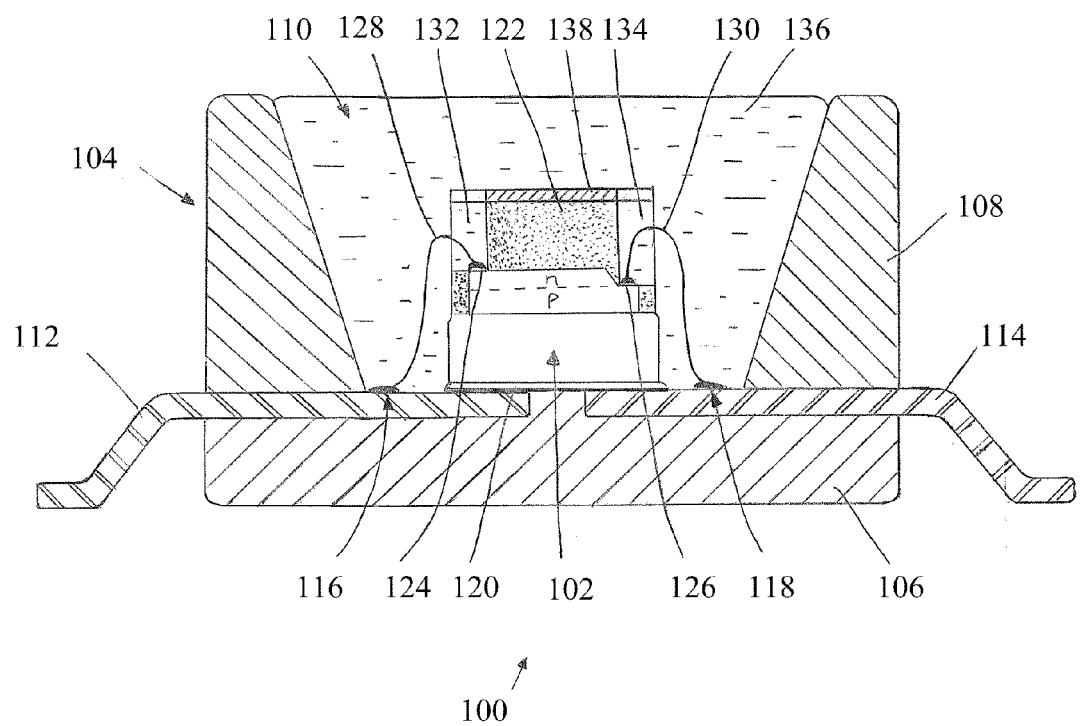
FIG. 3 is a schematic sectional view of a light emitting device with wavelength conversion in accordance with the invention.

In this specification like reference numerals are used to denote like parts. FIG. 3 is a schematic sectional view of a white light emitting device 100 with phosphor wavelength conversion in accordance with the invention. The device 100 is based on a surface emitting LED chip 102, such as for example a gallium nitride (GaN) based LED chip that emits blue light of wavelength ≈400 nm to ≈450 nm. The LED chip 102 is packaged in a package (housing) 104. The package 104, which can for example comprise a low temperature co-fired ceramic (LTCC) or high temperature polymer, comprises lower and upper body parts 106, 108. The upper body part 108 defines a recess 110, typically circular in shape, which is configured to receive the LED chip 102. The package 104 further comprises electrical connectors 112, 114 that define corresponding electrode contact pads 116, 118 on the floor of the recess 110. Using adhesive or eutectic soldering 120 the LED chip 102 is mounted to the floor of the recess 110. In accordance with the invention the LED chip 102 further comprises a coating of a phosphor/polymer material 122 over its light emitting surface (i.e. upper surface as illustrated). The phosphor/polymer layer 122 also extends over the edges of the LED chip 102 which will, to a lesser extent, also emit light. N-type and p-type electrode pads 124, 126 on the upper surface of the LED chip 102 are electrically connected to a corresponding electrode contact pad 116, 118 on the floor of the package by bond wires 128, 130 that pass down a respective blind hole (passage) 132, 134 in the phosphor/polymer layer 122. Having electrically connected the LED chip the recess 110 is then completely filled with a transparent polymer material 136, typically a silicone, to protect the bond wires 128, 130. As will be described the LED chip 102 can optionally further comprise a passivation layer 138 on top of the phosphor/polymer layer 122.

Figure 4:
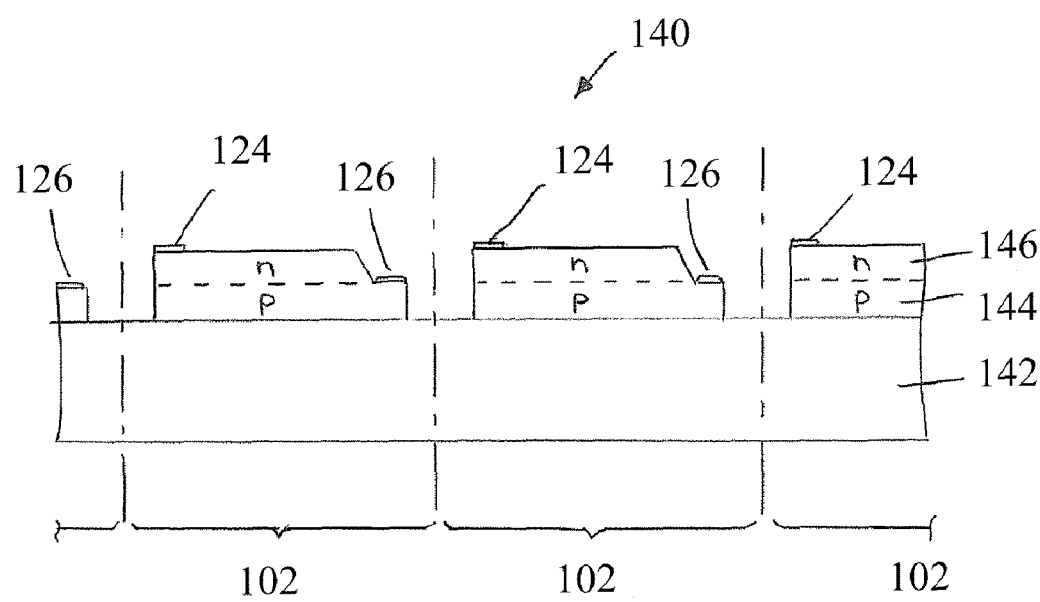
FIG. 4 is a schematic sectional view of a light emitting diode (LED) wafer.

Methods in accordance with the invention will be described in relation to the manufacture of the white light emitting device 100 of FIG. 3 and in particular to the application/processing of the phosphor/polymer layer 122 on the LED chip 102. FIG. 4 is a schematic sectional view of a GaN-based LED wafer 140. The LED wafer 140 comprises a sapphire ($Al_2O_3$) wafer (substrate) 142 on a surface of which there is fabricated a plurality of LED chips 102 in which each LED chip comprises p-type and n-type Ga—N-based material layers 144, 146 and the n-type and p-type electrodes 124, 126. It will be appreciated that the LED chips shown are highly simplified and intended to be exemplary only. In practice each LED chip will comprise more complex architectures such as for example single quantum well (SQW) or multiple quantum well (MQW) structures, one or more pumping or current spreading layers, n-type and p-type cladding layers, buried electrode layers etc. Whilst in the example described each LED 102 has n-type and p-type electrodes 124, 126 that are located on the upper light emitting surface, the method of the invention applies equally to LEDs having other electrode configurations such as those in which there is one electrode on the light emitting face and an electrode plane on an opposite face. Typically the sapphire wafer 102 is a two inch (2") diameter circular wafer of thickness ≈500 nm on which between 500 and 10,000 LEDs 102 are fabricated. The method will be described in relation to the application/processing of the phosphor/polymer layer 122 on a two inch wafer with ≈1500, 1 mm×1 mm LED chips 102. It will be appreciated that the method can be applied to three (3") and four inch (4") wafers.

Method 1

A method in accordance with a first embodiment of the invention will be described in relation to FIGS. 5a to 5f which shows schematically the method steps of the invention for fabricating the white light emitting device 100 of FIG. 3 with a specific CCT (for example 3000K).

Figures 5A, 5B:
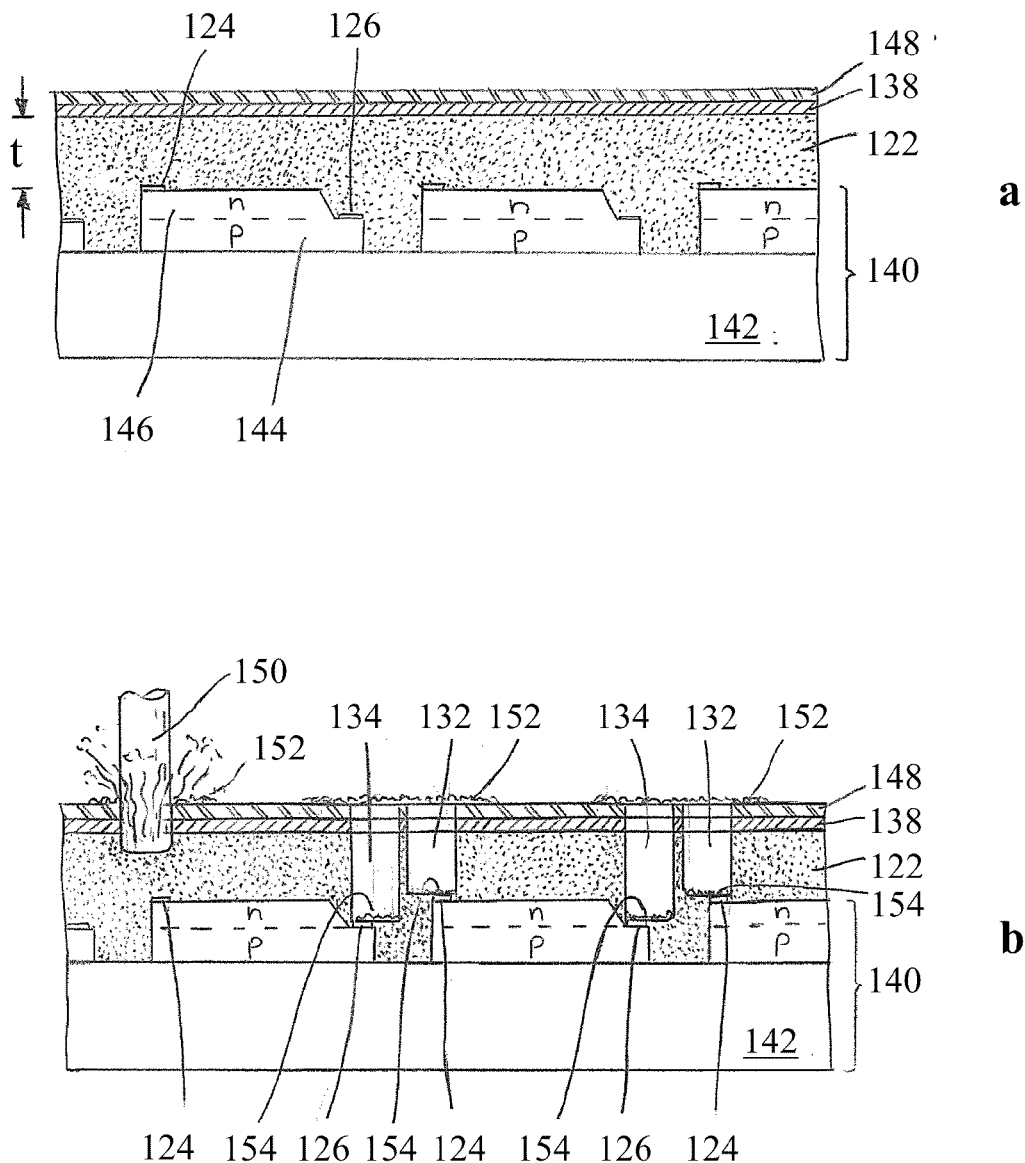
FIGS. 5a to 5f are schematic representations of method steps for manufacturing the light emitting device of FIG. 3 according to a method of the invention.

Step 1—FIG. 5a: As is known on a given LED wafer there can be a significant variation in both intensity and wavelength of light emitted from individual LED chips that are nominally the same. In order to determine the required thickness "t" (FIG. 5a) and weight loading of phosphor material to light transmissive polymer of the phosphor/polymer layer 122 to achieve a selected CCT, the LED wafer is first mapped by powering individual LEDs on the wafer using probes and the intensity and wavelength of light from each measured. Every LED on the wafer can be mapped or a representative sample, such as ≈50%, mapped. The required weight loading and thickness "t" is calculated from the LED wafer mapping. The phosphor loading and/or thickness "t" can be matched to the LED chips requiring the least amount of phosphor to avoid the need to remove phosphor. Those devices out of specification can be brought within specification by subsequent addition of additional phosphor. Alternatively the loading and/or thickness of the phosphor/polymer layer 122 can be matched to maximize the number of devices having a selected having CCT of the emission product.

The phosphor (photoluminescent) material, which is in powder form, is thoroughly mixed in pre-selected proportions with a light transmissive (transparent) polymer material such as for example a transparent silicone or epoxy. Examples of light transmissive polymer materials can include Shin-Etsu MicroSi, Inc's flexible silicone KJR-9022 and GE's silicone RTV615. The weight ratio loading of phosphor to silicone is typically in a range 35 to 85 parts per 100 with the exact loading depending on the required CCT of the emission product of the device. The phosphor/polymer is deposited over the face of the wafer 100 on which the LED chips 102 are fabricated such as to form a uniform thickness layer 122 over the entire surface of the LED wafer 100. As can be seen in FIG. 5a the phosphor/polymer 122 not only forms a uniform thickness layer over the entire light emitting surface (i.e. upper surface as shown) of each LED chip 102 but also fills the space between adjacent LED chips which, as will be described, eventually forms a phosphor/polymer coating on the edges of each LED chip. The phosphor/polymer layer 122 is conveniently applied to the wafer by spin-coating, doctor blading, tape-casting, spraying, inkjet printing or by other deposition techniques that will be apparent to those skilled in the art. The thickness "t" of the phosphor/polymer layer 122 is typically of order 100 μm to 200 μm. As described above the thickness "t" will depend on the target CCT of light generated by the device.

The polymer material can be ultra violet (U.V.) curable and cured by irradiating the phosphor/polymer material to U.V. radiation. Alternatively the polymer material can be thermally curable material and LED wafer with phosphor/polymer material placed in a temperature controlled environment to cure the polymer. It will be appreciated that in the case where the polymer material cures at room temperature the curing can be achieved by waiting a pre-selected period of time and therefore the invention applies to both actively and passively curing the polymer material.

Optionally a light transmissive passivation layer 138 is applied over the phosphor/polymer layer 122 and provides environmental protection of the phosphor/polymer layer 122 by reducing the ingress of moisture into the phosphor material. The passivation layer 138 can comprise a polymer material such as a silicone material or a silica material such as a spin on glass formed using a colloidal silica (silica sol) such as tetraethyl orthosilicate (TEOS-Si(OCH$_2$CH$_3$)$_4$) or tetramethyl orthosilicate (TMOS-Si(OCH$_3$)$_4$). The passivation layer is coated onto the phosphor/polymer layer 122 by spin-coating, doctor blading, tape-casting, spraying, inkjet printing or by other deposition techniques that will be apparent to those skilled in the art. When the passivation layer comprises a spin on glass the passivation layer is heat treated to convert the material to silica (SiO$_2$). Typically the passivation layer is of a thickness of order 10 µm to 20 µm.

A sacrificial layer 148 is then applied over the entire surface of the passivation layer 138. The sacrificial layer 148 is used to provide protection of the phosphor/polymer layer 122 (and passivation layer 138 when present) and is used to collect debris generated during subsequent processing of the phosphor/polymer layer 122. The sacrificial layer 148 preferably comprises a soluble material such as polyvinyl alcohol (PVA) that is coated onto the passivation layer 138 by spin-coating, doctor blading, tape-casting, spraying, inkjet printing or by other deposition techniques that will be apparent to those skilled in the art. Typically the sacrificial layer 148 is of thickness of order 10 µm to 20 µm. Since PVA is hydrophilic whilst the silicone in the phosphor/polymer layer 122 is hydrophobic it is envisaged to add a solvent such as isopropyl alcohol to the PVA to enable proper wetting of the sacrificial layer 148. Alternatively, as will be described the sacrificial layer 148 can comprise a physically removable polymer film such as Mylar® or Nitto® tape manufactured by Nitto Denko Corporation.

Step 2—FIG. 5b: The blind holes (passages) 132, 134 corresponding to each LED's n-type and p-type electrode pads 124, 126 are drilled through the sacrificial 148, passivation 138 and phosphor/polymer 122 layers using a laser beam 150. The laser can for example comprise a Nd:YAG (neodymium-doped yttrium aluminum garnet) laser (wavelength 532 nm) or a UV LED laser (wavelength 354 nm). The laser beam 150 was used to form holes of typically order 50 µm to 150 µm in diameter. In a surface emitting LED the electrode pads 124, 126 are located on the light emitting face close to the edges of the chip to maximize LED light emission and depending on the packing density of LEDs 102 on the LED wafer the holes 132, 134 on neighboring LEDs will typically extend into slots that are subsequently formed between the LEDs (see Step 3) or may overlap each other (not shown).

When operating the laser in a continuous mode of operation to drill each hole it is found that a "haloing" around each hole can occur which is believed to result from a localized thermal degradation of the phosphor material (e.g. conversion of Eu$^{2+}$ to Eu$^{3+}$ in a divalent europium activated phosphor) in the phosphor/polymer layer surrounding the hole and/or separation (de-lamination) of the phosphor/polymer layer from the LED wafer 140. To reduce and/or eliminate the haloing effect it is preferable to operate the laser in a pulsed mode of operation and to form each hole using a train of pulses, for example between 10 and 300 laser pulses per hole. For example in one arrangement each pulse is of order 2 µs in duration with approximately 31 µs between pulses enabling each hole to be drilled in about 0.3 ms to 10 ms. It is envisaged that it should be possible to drill all of the holes (e.g. 3000 for a wafer containing 1500 LED chips) on the LED wafer in about 10 to 30 s. In one arrangement the wafer is moved relative to the beam between laser pulses in an incremental stepwise manner to define a circle of a selected diameter. It will be appreciated that the intensity and/or number of pulses can be used to control the depth of each hole. Debris 152 generated by the laser drilling process accumulates on the surface of the sacrificial layer 148 whilst debris and/or residual phosphor/polymer material 154 can remain on the floor of each hole. To eliminate the need of the sacrificial layer 148 it is envisaged whilst laser drilling the holes to use a stream of nitrogen, air, inert or other gas to blow the debris away and off the surface of the LED wafer. It is also envisaged to vacuum up debris whilst laser drilling the holes.

Figures 5C, 5D:
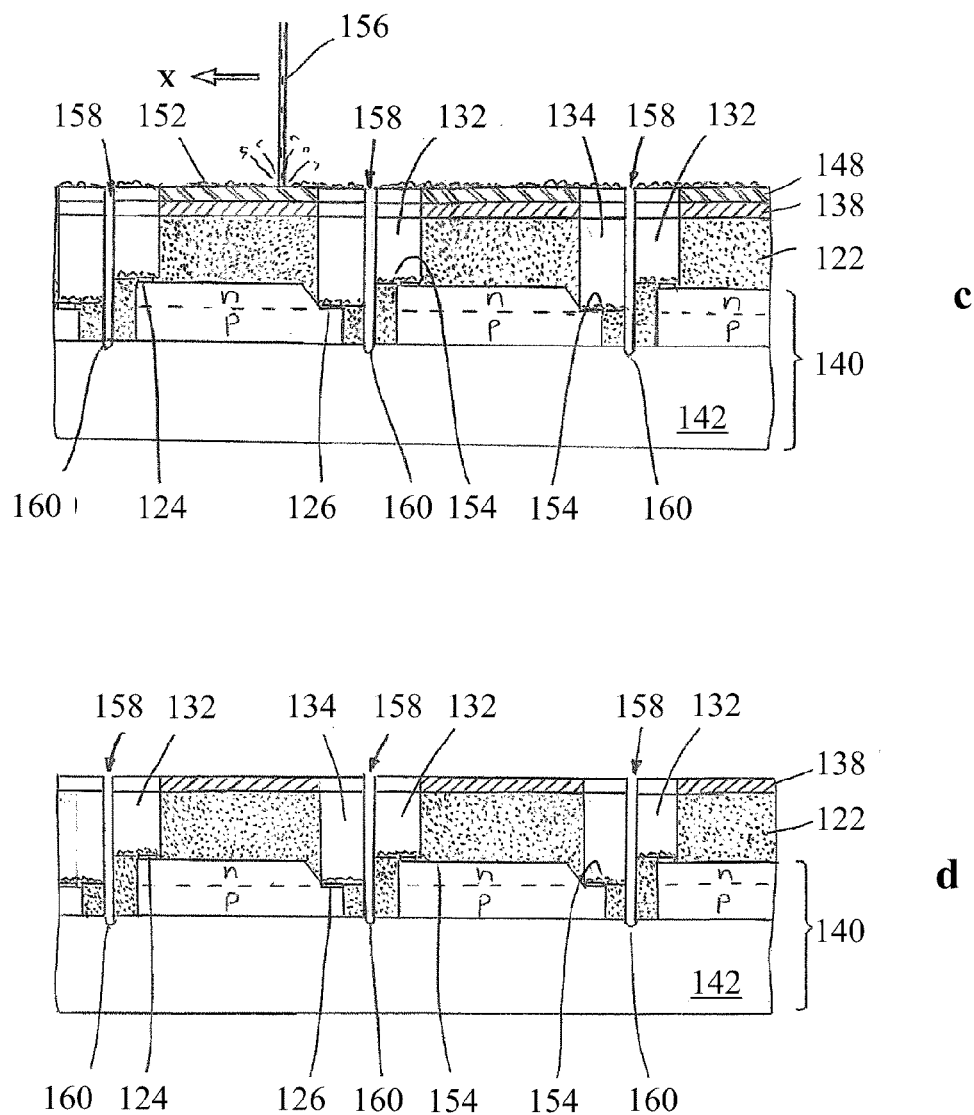

Step 3—FIG. 5c: The sacrificial 148, passivation 138 and phosphor/polymer 122 layers are then cut by a laser beam 156 in mutually orthogonal directions (x- and y-directions) to form a square grid of slots 158 that pass through the entire thickness of the phosphor/polymer layer 122 and partially into the underlying wafer 142. The slots 158, hereinafter referred to as "streets" and "avenues", are configured to run between LED chips 102 and correspond to where the LED wafer 140 will be subsequently divided into individual LED chips 102. The width of each slot is selected such that a layer of phosphor/polymer material 122 remains on the edges of each LED chip. In FIG. 5c the slots 158 run into and out of the plane of the paper in a y-direction. No slots running in an x-direction are shown in FIG. 5c.

Step 4—FIG. 5d: The sacrificial layer 148 is removed together with the debris 152 by dissolving the sacrificial layer in a suitable solvent, preferably water.

Figure 5E:
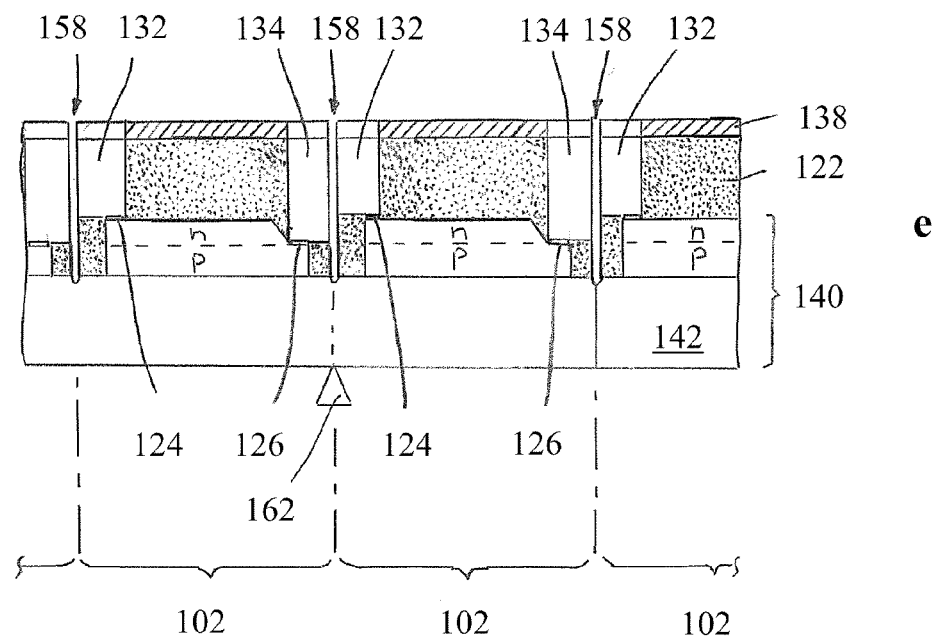

Step 5—FIG. 5e: The LED wafer assembly is then processed, using for example plasma ashing, to remove any residual debris/phosphor/polymer 154 at the base of the blind holes 132, 134 overlying the electrode pads 124, 126.

Figure 5F:
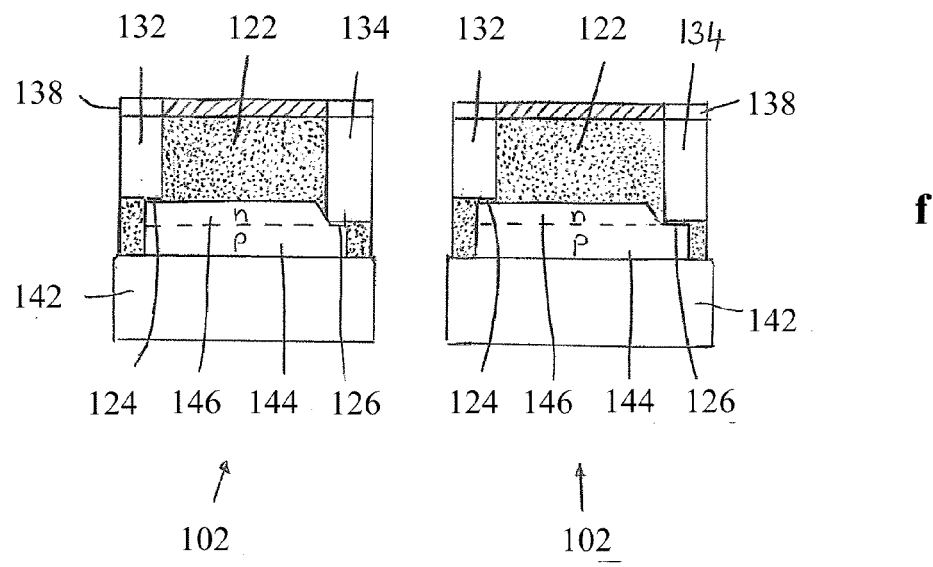

Step 6—FIGS. 5e and 5f: The LED wafer 140 is divided (diced) into individual devices using a blade 162 to break (snap) the substrate 142 along the lines 160 corresponding to the streets and avenues 158. Alternatively, the LED wafer 140 can be divided by cutting using a diamond saw or by other techniques that will be readily apparent to those skilled in the art. Each LED chip 102 is packaged as previously described in relation to FIG. 3.

Figure 6A:
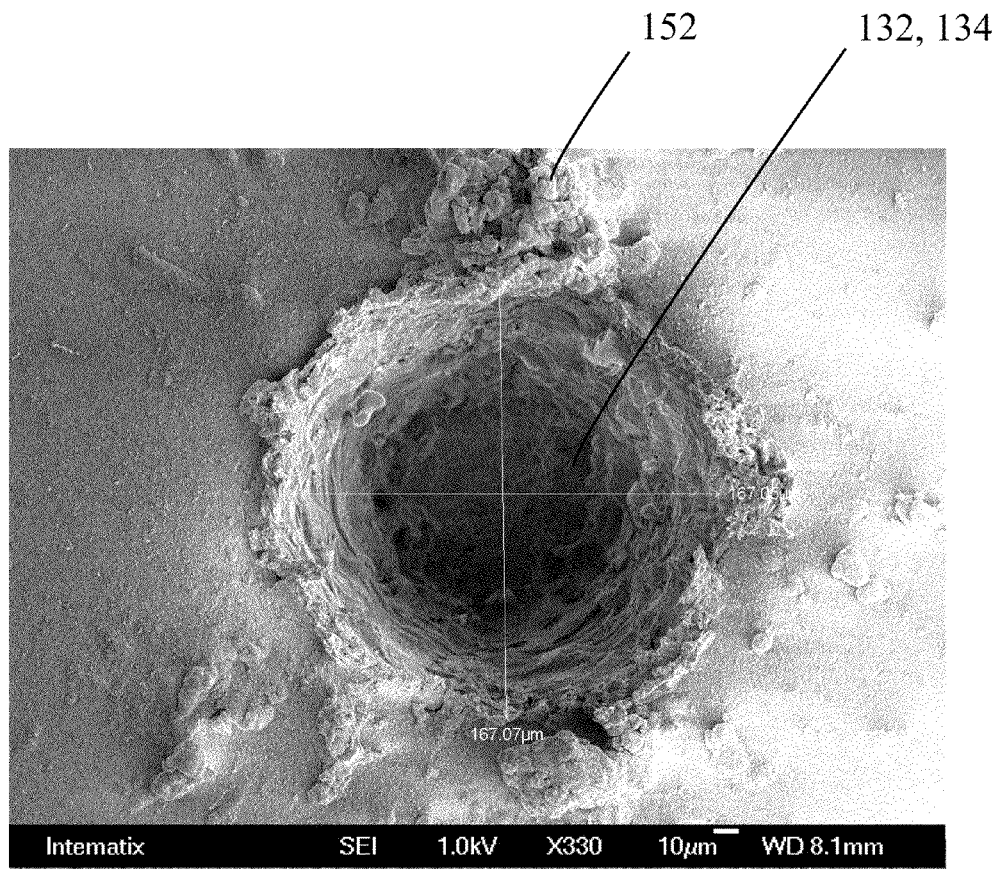
FIGS. 6a and 6b are electron micrographs of laser drilled (ablated) holes in accordance with the invention.

FIG. 6a is an SEM (Scanning Electron Microscope) electron micrograph of a laser drilled hole 132, 134 in the phosphor/polymer layer 122. In this example the light transmissive polymer material is GE's RTV615 silicone and the hole formed using a 7 watt Nd:YAG laser (532 nm). The hole 132, 134 was formed using forty pulses with a pulse repetition frequency of 5 kHz and a nominal beam diameter of ≈70 µm. The laser was translated to trace out a 100 µm diameter circle. As can be seen from the figure the resultant hole is substantially circular with a diameter of ≈170 µm.

Figure 6B:
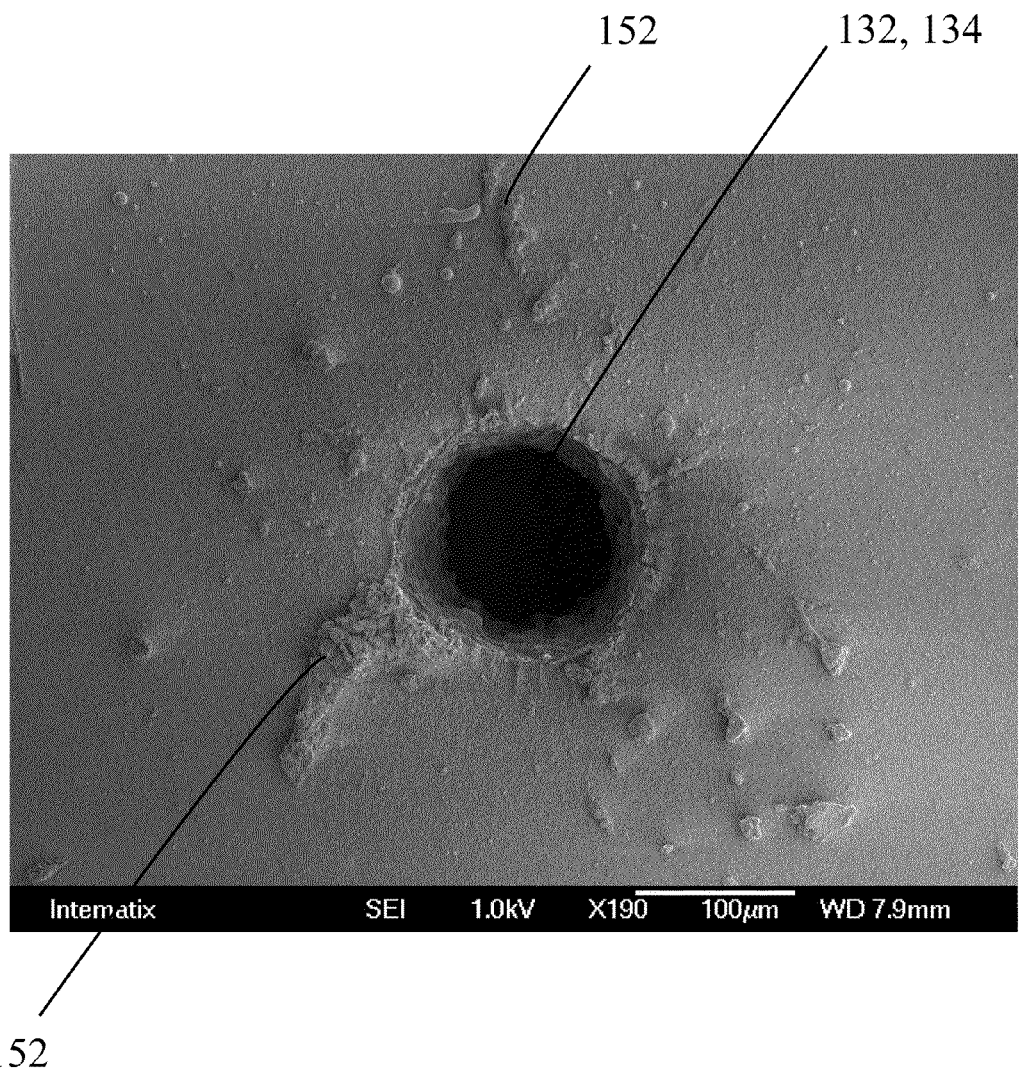

FIG. 6b is an SEM (Scanning Electron Microscope) electron micrograph of a laser drilled hole 132, 134 in the phosphor/polymer layer 122. Again the light transmissive polymer material is GE's RTV615 silicone and the hole was drilled using a 7W Nd:YAG laser (532 nm). The hole was formed using twenty pulses with a pulse repetition frequency of 5 kHz and a nominal beam diameter of ≈70 µm. In this example the laser was not moved between laser pulses. As can be seen from this figure the resultant hole is substantially circular with a diameter of ≈100 µm.

Method 2

Figure 7A:
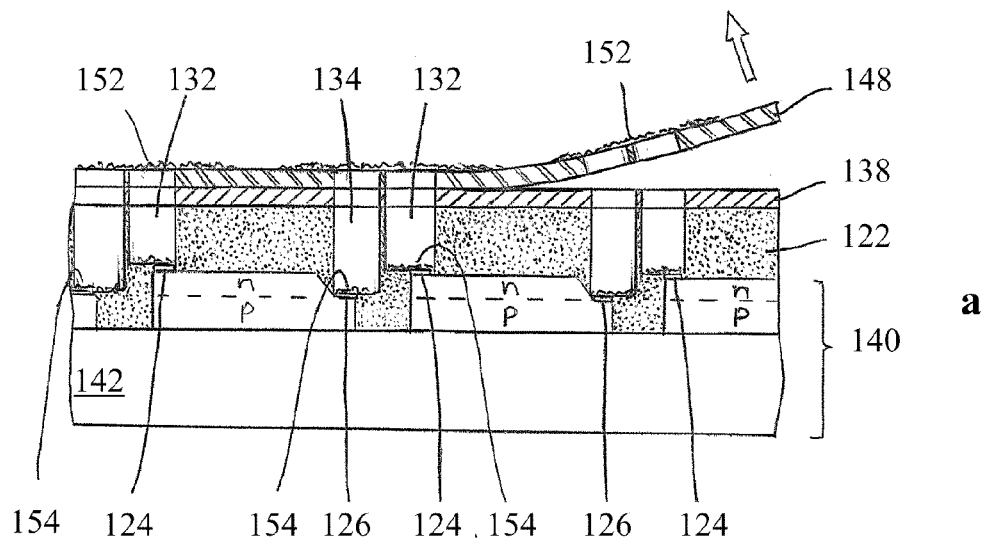
FIGS. 7a and 7b are schematic representations of alternative method steps according to a further method of the invention.
Figure 7B:
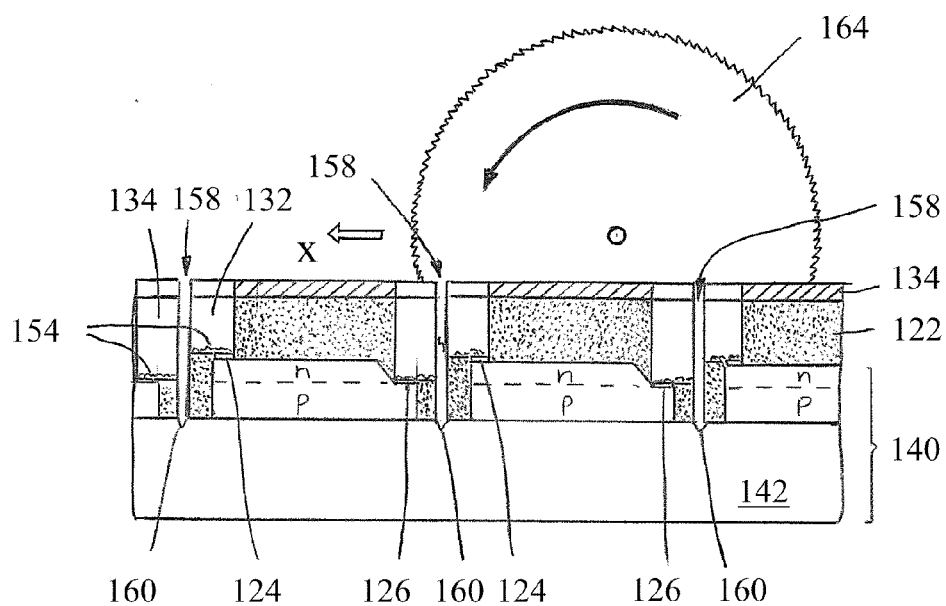

In an alternative method in accordance with the invention the streets and avenues (slots) 158 can be formed in the phosphor/polymer layer 122 by mechanical sawing of the phosphor/polymer layer 122. FIGS. 7a and 7b illustrate the method steps of the invention in which these steps replace steps 3 and 4 illustrated in FIGS. 5c and 5d respectively.

Step 1—FIG. 7a: In this method of the invention the sacrificial layer 148 preferably comprises a removable polymer film such as Mylar® or Nitto® tape manufactured by Nitto Denko Corporation as opposed to a dissolvable material. After laser drilling the blind holes 132, 134 the sacrificial layer 148 is removed together with the debris 152.

Step 2—FIG. 7b: The streets and avenues (slots) 158 are cut by mechanically sawing the phosphor/polymer layer 122 using for example a diamond saw 164.

The methods in accordance with the invention can be used in the high volume production of light emitting devices with phosphor wavelength conversion. A particular benefit of the methods of the invention is that they can produce devices with a more consistent color and/or CCT and can eliminate the need for binning.

The methods of the invention are suitable for applying phosphor material(s) in a powder form which can comprise an inorganic or organic phosphor such as for example silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in our co-pending U.S. patent application publication No. US 2007/0029526 A1 and U.S. Pat. Nos. 7,311,858 B2, 7,575,697 B2 and 7,601,276 B2 (all assigned to Internatix Corporation) the content of each of which is hereby incorporated by way of reference thereto.

As taught in U.S. Pat. No. 7,575,697 B2, a europium ($Eu^{2+}$) activated silicate-based green phosphor has the general formula $(Sr,A_1)_x(Si,A_2)(O,A_3)_{2+x}:Eu^{2+}$ in which: $A_1$ is at least one of a $2^+$ cation, a combination of $1^+$ and $3^+$ cations such as for example Mg, Ca, Ba, zinc (Zn), sodium (Na), lithium (Li), bismuth (Bi), yttrium (Y) or cerium (Ce); $A_2$ is a $3^+$, $4^+$ or $5^+$ cation such as for example boron (B), aluminum (Al), gallium (Ga), carbon (C), germanium (Ge), N or phosphorus (P); and $A_3$ is a $1^-$, $2^-$ or $3^-$ anion such as for example F, Cl, bromine (Br), N or S. The formula is written to indicate that the $A_1$ cation replaces Sr; the $A_2$ cation replaces Si and the $A_3$ anion replaces oxygen. The value of x is an integer or non-integer between 1.5 and 2.5.

U.S. Pat. No. 7,311,858 B2 disclose a silicate-based yellow-green phosphor having a formula $A_2SiO_4:Eu^{2+}D$, where A is at least one of a divalent metal comprising Sr, Ca, Ba, Mg, Zn or cadmium (Cd); and D is a dopant comprising F, Cl, Br, iodine (I), P, S and N. The dopant D can be present in the phosphor in an amount ranging from about 0.01 to 20 mole percent and at least some of the dopant substitutes for oxygen anions to become incorporated into the crystal lattice of the phosphor. The phosphor can comprise $(Sr_{1-x-y}Ba_xM_y)SiO_4:Eu^{2+}D$ in which M comprises Ca, Mg, Zn or Cd and where $0 \leq x \leq 1$ and $0 \leq y \leq 1$.

U.S. Pat. No. 7,601,276 B2 teach a two phase silicate-based phosphor having a first phase with a crystal structure substantially the same as that of $(M1)_2SiO_4$; and a second phase with a crystal structure substantially the same as that of $(M2)_3SiO_5$ in which M1 and M2 each comprise Sr, Ba, Mg, Ca or Zn. At least one phase is activated with divalent europium ($Eu^{2+}$) and at least one of the phases contains a dopant D comprising F, Cl, Br, S or N. It is believed that at least some of the dopant atoms are located on oxygen atom lattice sites of the host silicate crystal.

US 2007/0029526 A1 disclose a silicate-based orange phosphor having the formula $(Sr_{1-x}M_x)_yEu_zSiO_5$ in which M is at least one of a divalent metal comprising Ba, Mg, Ca or Zn; $0<x<0.5$; $2.6<y<3.3$; and $0.001<z<0.5$. The phosphor is configured to emit visible light having a peak emission wavelength greater than about 565 nm.

The phosphor can also comprise an aluminate-based material such as is taught in our co-pending U.S. patent application publication No. US 2006/0158090 A1 and U.S. Pat. No. 7,390,437 B2 (also assigned to Internatix Corporation) or an aluminum-silicate phosphor as taught in co-pending application US 2008/0111472 A1 the content of each of which is hereby incorporated by way of reference thereto.

US 2006/0158090 A1 to Wang et al. teach an aluminate-based green phosphor of formula $M_{1-x}Eu_xAl_yO_{[1+3y/2]}$ in which M is at least one of a divalent metal comprising Ba, Sr, Ca, Mg, manganese (Mn), Zn, copper (Cu), Cd, samarium (Sm) or thulium (Tm) and in which $0.1<x<0.9$ and $0.5 \leq y \leq 12$.

U.S. Pat. No. 7,390,437 B2 disclose an aluminate-based blue phosphor having the formula $(M_{1-x}Eu_x)_{2-z}Mg_zAl_yO_{[2+3y/2]}$ in which M is at least one of a divalent metal of Ba or Sr. In one composition the phosphor is configured to absorb radiation in a wavelength ranging from about 280 nm to 420 nm, and to emit visible light having a wavelength ranging from about 420 nm to 560 nm and $0.05<x<0.5$ or $0.2<x<0.5$; $3 \leq y \leq 12$ and $0.8 \leq z \leq 1.2$. The phosphor can be further doped with a halogen dopant H such as Cl, Br or I and be of general composition $(M_{1-x}Eu_x)_{2-z}Mg_zAl_yO_{[2+3y/2]}:H$.

US 2008/0111472 A1 to Liu et al. teach an aluminum-silicate orange-red phosphor with mixed divalent and trivalent cations of general formula $(Sr_{1-x-y}M_xT_y)_{3-m}Eu_m(Si_{1-z}Al_z)O_5$ in which M is at least one divalent metal selected from Ba, Mg or Ca in an amount ranging from $0 \leq x \leq 0.4$; T is a trivalent metal selected from Y, lanthanum (La), Ce, praseodymium (Pr), neodymium (Nd), promethium (Pm), Sm, gadolinium (Gd), terbium (Tb), dysprosium (Dy), holmium (Ho), Erbium (Er), Tm, ytterbium (Yt), lutetium (Lu), thorium (Th), protactinium (Pa) or uranium (U) in an amount ranging from $0 \leq y \leq 0.4$ and z and m are in a range $0 \leq z \leq 0.2$ and $0.001 \leq m \leq 0.5$. The phosphor is configured such that the halogen resides on oxygen lattice sites within the silicate crystal.

The phosphor can also comprise a nitride-based red phosphor material such as is taught in our co-pending United States patent applications Publication No. US 2009/0283721 A1 published Nov. 19, 2009 and Ser. No. 12/632,550 filed Dec. 7, 2009 entitled "Nitride-based red-emitting phosphors in RGB (red-green-blue) lighting systems", the content of each of which is hereby incorporated by way of reference thereto. US 2009/0283721 A1 and 12/632,550 teach nitride-based red phosphor having the formula $M_mM_aM_bD_{3w}N_{[(2/3)m+z+a+(4/3)b-w]}Z_x$ where $M_m$ is a divalent element selected from beryllium (Be), Mg, Ca, Sr, Ba, Zn, Cd or mercury (Hg); $M_a$ is a trivalent element selected from B, Al, Ga, indium (In), Y, selenium (Se), P, arsenic (As), La, Sm, antimony (Sb) or Bi; $M_b$ is a tetravalent element selected from C, Si, Ge, tin (Sn), Ni, hafnium (Hf), molybdenum (Mo), tungsten (W), chromium (Cr), lead (Pb), titanium (Ti) or zirconium (Zr); D is a halogen selected from F, Cl, Br or I; Z is an activator selected from europium (Eu), Ce, manganese (Mn), Tb or samarium (Sm), and N is nitrogen in amounts $0.01 \leq m \leq 1.5$, $0.01 \leq a \leq 1.5$, $0.01 \leq b \leq 1.5$, $0.0001 \leq w \leq 0.6$ and $0.0001 \leq z \leq 0.5$. The phosphor is configured to emit visible light with an emission peak wavelength greater than 640 nm.

It will be appreciated that the phosphor material is not limited to the examples described herein and can comprise any phosphor material including both organic or inorganic phosphor materials such as for example nitride and/or sulfate phosphor materials, oxy-nitrides and oxy-sulfate phosphors or garnet materials (YAG).

It will be further appreciated that the present invention is not restricted to the specific embodiments described and that variations can be made that are within the scope of the invention. For example, the method of the invention can be used to the application/processing of the phosphor/polymer layer on other LED wafers such as silicon carbide (SiC), zinc selenide (ZnSe), indium gallium nitride (InGaN), aluminum nitride (AlN) or aluminum gallium nitride (AlGaN) based LED chips.

What is claimed is:

1. A method of manufacturing a light emitting device comprising:
   a) depositing over substantially the entire surface of a light emitting diode wafer having an array of light emitting diodes formed on a surface thereof a mixture of at least one phosphor and a polymer material, wherein the polymer material is transmissive to light generated by the LEDs and to light generated by the at least one phosphor material;
   b) using laser ablation, selectively making apertures in the phosphor/polymer material corresponding to electrode contact pads of each LED thereby enabling access to each electrode contact pad; and
   c) dividing the LED wafer into individual light emitting devices.

2. The method according to claim 1, and comprising selecting a thickness of the phosphor/polymer material and weight loading of the at least one phosphor material to polymer material of the phosphor/polymer material on a basis of LEDs on the LED wafer having substantially the same emission characteristics.

3. The method according to claim 2, wherein the LEDs having substantially the same emission characteristics emit light of substantially the same intensity and/or emission wavelength.

4. The method according to claim 2, and comprising selecting a thickness of the phosphor/polymer material and weight loading of the at least one phosphor material to polymer material of the phosphor/polymer material to correspond to LEDs requiring a least amount of phosphor material.

5. The method according to claim 2, and comprising selecting a thickness of the phosphor/polymer material and weight loading of the at least one phosphor material to polymer material of the phosphor/polymer material to correspond to the greatest number of LEDs on the wafer having substantially the same emission characteristics.

6. The method according to claim 1, and comprising making the apertures using a series of laser pulses.

7. The method according to claim 1, and prior to dividing the wafer in c) further comprising the processing LED wafer to remove any remaining phosphor/polymer mixture or other debris on the base of each aperture.

8. The method according to claim 7, and comprising plasma ashing the wafer to remove any remaining phosphor/polymer mixture or other debris on the base of each aperture.

9. The method according to claim 1, and prior to dividing the wafer in c) further comprising cutting slots through the phosphor/polymer material which are configured to pass between individual LEDs.

10. The method according to claim 9, wherein each slot further extends into the LED wafer to thereby aid in subsequent division of the wafer.

11. The method according to claim 9, wherein the slots are cut by a method selected from the group consisting of laser ablation and mechanical sawing.

12. The method according to claim 9, wherein the slots are configured such that a layer of phosphor/polymer material remains on the edges of each LED after division of the wafer into individual light emitting devices.

13. The method according to claim 1, and prior to making the apertures in b) comprising depositing a sacrificial layer over the phosphor/polymer layer for collecting debris generated during making of the apertures.

14. The method according to claim 13, and further comprising removing the sacrificial layer and debris after making the apertures.

15. The method according to claim 14, wherein the sacrificial layer is removable and is physically removed from the LED wafer.

16. The method according to claim 14, wherein the sacrificial layer is dissolvable and is removed from the LED wafer by dissolving it in a solvent.

17. The method according to claim 13, wherein the sacrificial layer is selected from the group consisting of: poly vinyl alcohol, a polymer film, Nitto tape and Mylar.

18. The method according to claim 1, and comprising dividing the LED wafer by a method selected from the group consisting of: scribing and breaking, laser ablation and sawing.

19. The method according to claim 1, and further comprising packaging each light emitting device.

20. A light emitting device with phosphor wavelength conversion manufactured according to the method of claim 1.

* * * * *